US 6,526,474 B1

(12) United States Patent
Ross

(10) Patent No.: US 6,526,474 B1
(45) Date of Patent: *Feb. 25, 2003

(54) CONTENT ADDRESSABLE MEMORY (CAM) WITH ACCESSES TO MULTIPLE CAM ARRAYS USED TO GENERATE RESULT FOR VARIOUS MATCHING SIZES

(75) Inventor: Mark A. Ross, San Carlos, CA (US)

(73) Assignee: Cisco Technology, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/437,012

(22) Filed: Nov. 9, 1999

Related U.S. Application Data

(63) Continuation-in-part of application No. 09/426,574, filed on Oct. 25, 1999, now Pat. No. 6,374,326.

(51) Int. Cl.[7] .............................................. G06F 12/08
(52) U.S. Cl. ...................................... 711/108; 711/158
(58) Field of Search ................................ 711/108, 212, 711/158; 365/49

(56) References Cited

U.S. PATENT DOCUMENTS

| | | | |
|---|---|---|---|
| 3,648,254 A | 3/1972 | Beausoleil | 365/49 |
| 4,296,475 A | 10/1981 | Nederlof et al. | 711/108 |

(List continued on next page.)

OTHER PUBLICATIONS

Jon P. Wade and Charles G. Sodini; "A Ternary Content Addressable Search Engine," Aug. 1989; pp. 1003–1013; IEEE Journal of Solid–State Circuits, vol. 24, No. 4.

Teuvo Kohonen, Content–Addressable Memories, 1987, pp. 128–129 and 142–144, Springer–Verlang, New York.

Brian Dipert, ed., "Special–purpose SRAMs Smooth the Ride," EDN, Jun. 24, 1999, pp. 93–104.

"Extending the LANCAM Comparand," Application Brief AB–N3, Rev. 1.0a Draft, Music Semiconductors, Milpitas, CA, Sep. 30, 1998, 4 pages.

"Advantages of CAM in ASIC–Based Network Address Processing," Application Brief AB–N11, Rev. 1.2a Draft, Music Semiconductors, Milpitas, CA, Sep. 30, 1998, 4 pages.

"Virtual Memory Applications of the MU9C1480A LANCAM," Application Note AN–N3, Rev. 1a, Music Semiconductors, Milpitas, CA, Sep. 30, 1998, 12 pages.

"Using the MU9C1965A LANCAM MP for Data Wider than 128 Bits," Application Note AN–N19, Rev. 1a, Music Semiconductors, Milpitas, CA, Sep. 30, 1998, 16 pages.

"Fast IPv4 and IPv4 CIDR Address Translation and Filtering Using the MUAC Routing CoProcessor (RCP)," Application Note AN–N25, Rev. 0a, Music Semiconductors, Milpitas, CA, Oct. 1, 1998, 16 pages.

(List continued on next page.)

Primary Examiner—Reginald G. Bragdon
(74) Attorney, Agent, or Firm—The Law Office of Kirk D. Williams

(57) ABSTRACT

The invention provides a method and system for operating a CAM with a variable size input tag. The improved CAM has multiple access sizes and is divided into multiple stored match sections. Each of the multiple stored match sections can be independently matched against a portion of the input tag, responsive to a type field for each entry. A size selection circuit accumulates the independent match results; a priority encoder coupled thereto collects the accumulated matches and presents a match as an output from the CAM. Each CAM entry can be selected from a set of preselected sizes, each corresponding to a contemplated input tag size, such as 72 bits, 144 bits, or 288 bits.

62 Claims, 4 Drawing Sheets

U.S. PATENT DOCUMENTS

| | | | |
|---|---|---|---|
| 4,791,606 A | | 12/1988 | Threewitt et al. ............ 365/49 |
| 4,996,666 A | | 2/1991 | Duluk, Jr. .................... 365/49 |
| 5,088,032 A | | 2/1992 | Bosack ....................... 709/242 |
| 5,319,763 A | * | 6/1994 | Ho et al. .................... 711/108 |
| 5,383,146 A | | 1/1995 | Threewitt ................... 365/49 |
| 5,440,715 A | | 8/1995 | Wyland ...................... 711/108 |
| 5,450,351 A | | 9/1995 | Heddes ....................... 365/49 |
| 5,481,540 A | | 1/1996 | Huang ........................ 370/401 |
| 5,515,370 A | | 5/1996 | Rau ........................... 370/399 |
| 5,740,171 A | | 4/1998 | Mazzola et al. ............ 370/392 |
| 5,841,874 A | | 11/1998 | Kempke et al. ............ 713/160 |
| 5,842,040 A | | 11/1998 | Hughes et al. ............. 710/11 |
| 5,898,689 A | | 4/1999 | Kumar et al. .............. 370/232 |
| 5,920,886 A | | 7/1999 | Feldmeier ................... 711/108 |
| 5,930,359 A | * | 7/1999 | Kempke et al. ............ 365/49 |
| 5,956,336 A | | 9/1999 | Loschke et al. ............ 370/392 |
| 5,978,885 A | | 11/1999 | Clark, II .................... 711/108 |
| 6,000,008 A | * | 12/1999 | Simcoe ................. 365/189.01 |
| 6,041,389 A | | 3/2000 | Rao ........................... 711/108 |
| 6,047,369 A | | 4/2000 | Colwell et al. ............ 712/217 |
| 6,061,368 A | | 5/2000 | Hitzelberger .............. 370/537 |
| 6,069,573 A | | 5/2000 | Clark, II et al. ............ 341/50 |
| 6,081,440 A | | 6/2000 | Washburn et al. .......... 365/49 |
| 6,091,725 A | | 7/2000 | Cheriton et al. ............ 370/392 |
| 6,097,724 A | | 8/2000 | Kartalopoulos .......... 370/395.3 |
| 6,134,135 A | | 10/2000 | Andersson .................. 365/49 |
| 6,137,707 A | | 10/2000 | Srinivasan et al. ........... 365/49 |
| 6,141,738 A | | 10/2000 | Munter et al. .............. 711/206 |
| 6,148,364 A | * | 11/2000 | Srinivasan et al. ......... 365/226 |
| 6,154,384 A | | 11/2000 | Nataraj et al. ................ 365/49 |
| 6,175,513 B1 | | 1/2001 | Khanna ....................... 365/49 |
| 6,181,698 B1 | | 1/2001 | Hariguchi ................... 370/392 |
| 6,199,140 B1 | | 3/2001 | Srinivasan et al. ......... 711/108 |
| 6,236,658 B1 | | 5/2001 | Essbaum et al. ............ 370/401 |
| 6,237,061 B1 | * | 5/2001 | Srinivasan et al. ......... 711/108 |
| 6,240,003 B1 | | 5/2001 | McElroy ..................... 365/49 |
| 6,243,667 B1 | | 6/2001 | Kerr et al. .................... 703/27 |
| 6,246,601 B1 | | 6/2001 | Pereira ........................ 365/49 |
| 6,295,576 B1 | * | 9/2001 | Ogura et al. ................. 365/49 |
| 6,307,855 B1 | * | 10/2001 | Hariguchi ................... 370/392 |
| 6,374,326 B1 | | 4/2002 | Kansal et al. ............... 711/108 |
| 6,389,506 B1 | | 5/2002 | Ross et al. .................. 711/108 |

OTHER PUBLICATIONS

"Using MUSIC Devices and RCPs for IP Flow Recognition," Application Note AN–N27, Rev. 0, Music Semiconductors, Milpitas, CA, Oct. 21, 1998, 20 pages.

"Wide Ternary Searches Using Music CAMs and RCPs," Application Note AN–N31, Rev. 0, Music Semiconductors, Milpitas, CA, Apr. 13, 1999, 8 pages.

* cited by examiner

US 6,526,474 B1

CONTENT ADDRESSABLE MEMORY (CAM) WITH ACCESSES TO MULTIPLE CAM ARRAYS USED TO GENERATE RESULT FOR VARIOUS MATCHING SIZES

CROSS-REFERENCE TO RELATED APPLICATIONS

This is a continuation-in-part of application Ser. No. 09/426,574, filed Oct. 25, 1999, U.S. Pat. No. 6,374,326.

BACKGROUND OF THE INVENTION

1. Field of the Invention

This invention relates to a CAM with dynamic sequential multiple access sizes.

2. Related Art

A CAM (content addressable memory) is sometimes used in a computer system or device for storing and retrieving information. CAMs have the advantage that they can rapidly link associated data values with known tags; it is thus possible to perform rapid lookup of the associated data values once the tag is known. Known CAMs include comparison circuits for matching an input tag with each tag recorded in the CAM, so as to determine which if any of the elements in the CAM matches the tag.

One problem in the known art is that the comparison circuits in known CAMs operate so as to match the input tag with a fixed array of value bits. Thus, the input tag and the value array are both a fixed width that cannot be changed once the CAM is manufactured. (In some known CAMs, there is more than one different width, but that width is only selectable at a configuration time, or using a configuration pin.) This problem significantly reduces the flexibility and utility of CAMs, particularly when the input tags are contemplated as being of variable size. This problem also reduces the utility of CAMs in many systems, in that when CAM is manufactured to accommodate for the largest possible input tag, the CAM might either (a) have less capacity than required by the particular application, or (b) have significant unused capacity.

Accordingly, it would be desirable to provide a method and system for operating a CAM with a variable size input tag. This advantage is achieved in an embodiment of the invention in which a CAM has multiple access sizes, each of which can be accessed dynamically, even for sequential accesses to the CAM.

SUMMARY OF THE INVENTION

The invention provides a method and system for operating a CAM with a dynamically variable size input tag. The improved CAM has multiple access sizes, dynamically selectable by sequences of successive accesses to the CAM. A size selection circuit accumulates the independent match results. The size selection circuit logic determines which CAM entries are matched for each possible width of request value the CAM was designed for. For example, the size selection circuit can determine whether a selected 72-bit request matches a single CAM entry in one of the two CAM arrays. A priority encoder coupled to the size selection circuit collects the accumulated matches and presents a match as an output from the CAM.

In a preferred embodiment, each CAM entry can be selected from a set of preselected sizes, each corresponding to a contemplated input tag size, such as 72 bits, 144 bits, or 288 bits.

DETAILED DESCRIPTION OF THE PREFERRED EMBODIMENT

In the following description, a preferred embodiment of the invention is described with regard to preferred process steps and data structures. Those skilled in the art would recognize after perusal of this application that embodiments of the invention can be implemented using circuits adapted to particular process steps and data structures described herein, and that implementation of the process steps and data structures described herein would not require undue experimentation or further invention.

Overview

In a preferred embodiment, the CAM includes more than one CAM array for matching input tags, and a size selector for determining whether an input tag successfully matches CAM entries for selected tag widths. For example, if a first CAM array has an input width of M and a second CAM array has an input width of N, the size selector can determine whether the CAM matches input tags for width M, N, or (M+N). A priority encoder selects one such match (if there is one) for each selected width, and presents a set of match results to a result register. The result register holds the match results for selection or other processing by a processor operating in conjunction with the CAM.

In a preferred embodiment, the CAM entries are each associated with a set of mask bits (although sets of CAM entries can be associated with a set of collective mask bits), so that the CAM performs the function of a ternary or block-mask CAM. (As used herein, the phrase "block-mask CAM" includes a ternary CAM in which at least some of the sets of mask bits are associate with more than one CAM entry.) Thus, the processor can direct the CAM to match input tags of less than the full width of the CAM by setting mask bits in accordance therewith. If the CAM entries' width is large enough, the processor can combine multiple smaller matchable entries into a single CAM entry.

In a preferred embodiment, the CAM includes an accumulator register, which determines if a first and second portion of a selected input tag (with a total width greater than all CAM array widths) are both matched, and if so, to determine which CAM entries match that large input tag.

System Elements

Figure 1:
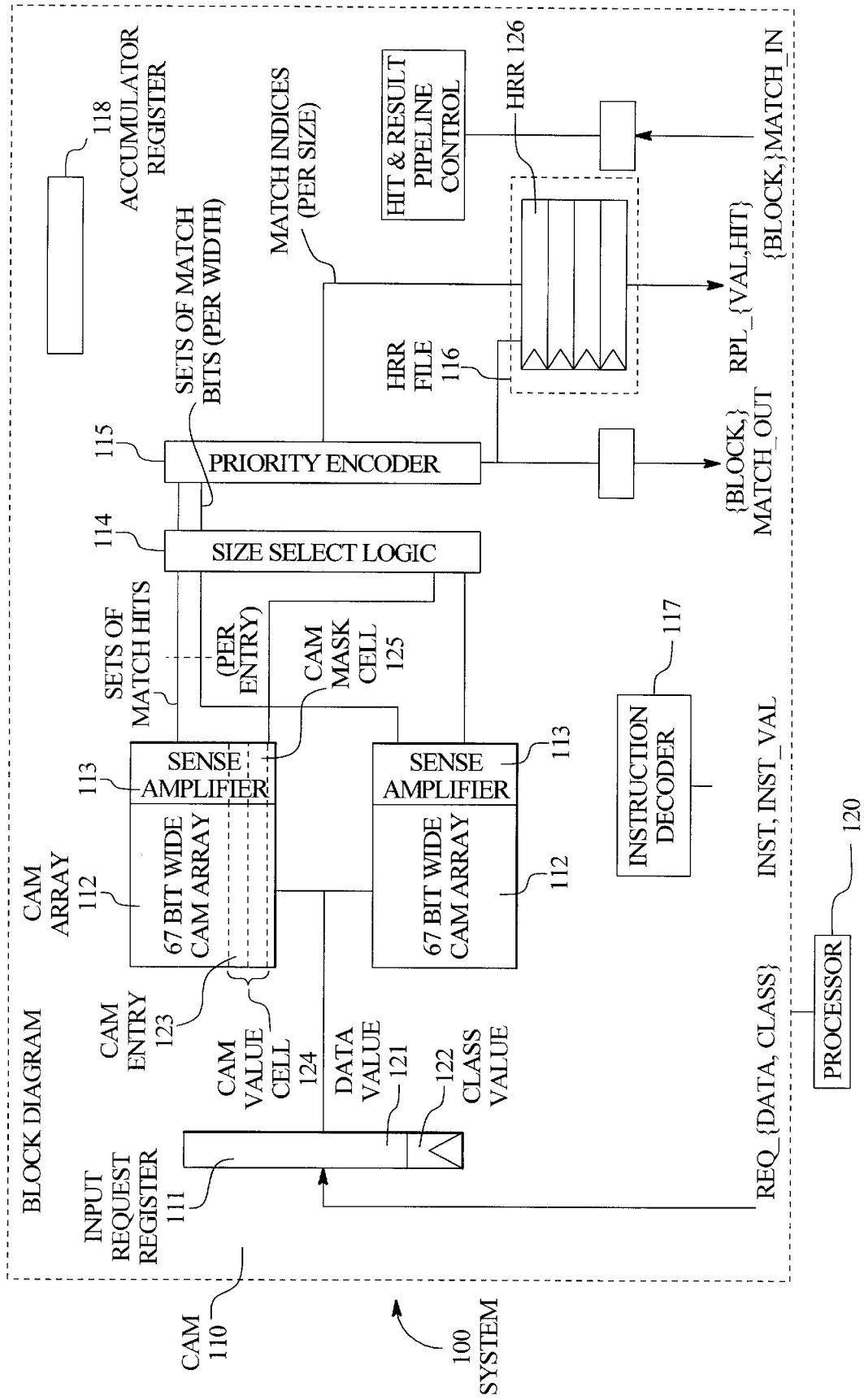
FIG. 1 shows a block diagram of a system including dynamic multiple access sizes within a CAM.

FIG. 1 shows a block diagram of a system including dynamic multiple access sizes within a CAM.

A system 100 includes a CAM 110, a processor 120 for interacting with and controlling the CAM 110, and communication and control circuits (not shown) coupling the CAM 110 and the processor 120.

The CAM 110 includes an input request element 111 including a request value, a set of CAM arrays 112, a set of sense amplifiers 113, a size selector 114, a priority encoder 115, an HRRF (hit result register file) 116, an instruction decoder and instruction control circuit 117, and an accumulator register 118.

The request register 111 is disposed to receive an input tag from the processor 120, for presentation to the CAM arrays 112. As described below, the request value in the request register 111 includes a preferred width of 72 bits.

The CAM arrays 112 are coupled to the request register 111 and disposed to each receive the same request value from the request register 111. The CAM arrays 112 include a set of CAM entries 123, each of which includes a set of CAM value cells 124 and is associated with a set of CAM mask cells 125. As noted above, the CAM arrays 112 can include ternary CAM arrays 112, or block-mask CAM arrays 112; that is, there can be more than one set of CAM value cells 124 associated with a single set of CAM mask cells 125.

In a preferred embodiment, each CAM array includes about 4 megabits of information (although in alternative embodiments, each CAM array can include a different amount of information, such as one megabit or two megabits), including about 32K CAM value cells 124 each having 72 bits, and about 4K CAM mask cells 125 each having the same width (thus having 72 mask bits). Thus, there are preferably about eight CAM values cells 124 for each CAM mask cell 125. However, there is no particular reason for selecting this ratio, which can be any other convenient ratio, including possibly 1:1.

Each CAM array 112 is coupled to a set of sense amplifiers .113 (preferably one sense amplifier for each CAM entry 123). The sense amplifiers 113 are disposed for attempting to determine whether the input request value in the request register 111 matches with each of the CAM entries 123.

The presence of CAM data cells 124 and CAM mask cells 125 for each CAM entry 112 means that the match performed by the sense amplifiers 113 is a ternary or pseudo-ternary match. Thus, some of the bits in the CAM data cells 124 might be ignored (treated as "don't care" bits) because associated bits in the CAM mask cells 125 indicate that matching is not performed for those CAM data cell 124 bits.

Each sense amplifier 113 generates a set of N match bits, where N is the number of CAM entries 123 in its associated CAM array 112. In a preferred embodiment, N is the same for each CAM array 112, but there is no particular requirement that this must be so.

Each of the sets of N match bits is coupled to the size selector 114. The size selector 114 is disposed for receiving the sets of N match bits and determining which CAM entries 123 were matched for each possible width of request value the CAM 110 is designed for.

For example, in a preferred embodiment, each CAM array 112 includes a width of 72 bits. The size selector 114 can determine whether a selected 72-bit request value matches one or more of the following:

A single CAM entry 123 in one of the two CAM arrays 112 (for a 72 bit match); or A matched pair of CAM entries 123 at corresponding locations in both of the two CAM arrays (for a 144 bit match).

With the aid of the accumulator register 118, the size selector 114 can also determine whether a selected 72-bit request value matches wider request values presented in the request register 111 in succeeding clock cycles. In a preferred embodiment, these can include a corresponding set of CAM entries 123 at locations in both of the two CAM arrays 112. (for a 288 bit match).

In a preferred embodiment, the size selector 114 generates several sets of N match bits, each indicating whether corresponding CAM entries 123 were matched for a selected input tag width.

For example, in a preferred embodiment having 32K CAM entries 123 in each CAM array 112, the size selector 114 generates a set of 64K match bits.

The several sets of N match bits are coupled to the priority encoder 115, which selects a highest priority match bit for each set. The highest priority match bit need not indicate the same CAM entry 123 for each input tag width. Responsive to the selected match bit, the priority encoder 115 generates a match index out of the CAM arrays 112 (a single value indicating a single CAM entry 123 in the set of multiple CAM arrays 112) for each selected input tag width.

The match indices generated by the priority encoder 115 are coupled to the HRR file 116, which includes a set of individual HRR (hit result registers) 126.

The HRR file 116 is coupled to the processor 120, and disposed so the processor 120 can access individual HRR 126, and use the match indices in those HRR 126 to read or write data bits or class bits into individual CAM entries 123. In a preferred embodiment, the HRR file 116 is disposed to operate in conjunction or in parallel with the CAM array 110 and other elements of the system 110, in a pipeline manner. Thus, the processor 120 can present request values to the CAM arrays 112, in a pipeline sequence and receive match indices in selected HRR 126 in response thereto, possible several clock cycles later.

In the following description, a preferred embodiment of the invention is described with regard to preferred process steps and data structures. Those skilled in the art would recognize after perusal of this application that embodiments of the invention can be implemented using general or special purpose processors, or other circuits, adapted to particular process steps and data structures described herein. Implementation of the process steps and data structures described herein would not require undue experimentation or further invention.

The instruction decoder and instruction control circuit 117 receives instructions, including operation codes, from the processor 120, designating instructions for the CAM array 112 to perform. In a preferred embodiment, these instructions can select reading or writing an individual CAM entry 123, reading or writing only the data bits or class bits in an individual CAM entry 123, or reading or writing only the CAM data cells 124 or CAM mask cells 125.

Method of Operation

Figure 2:
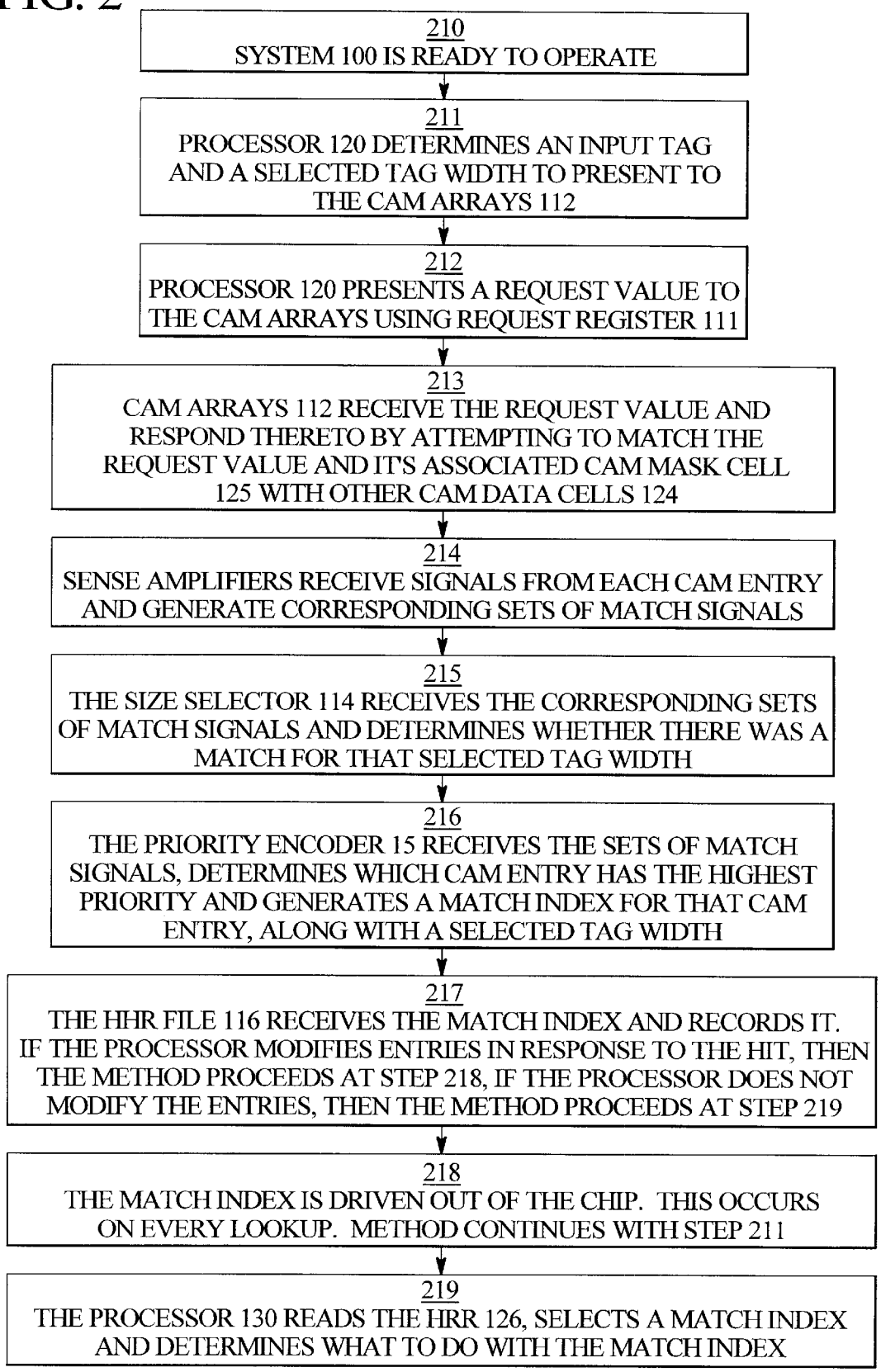
FIG. 2 shows a flow diagram of a method for operating a system including dynamic multiple access sizes within a CAM.

FIG. 2 shows a flow diagram of a method for operating a system including dynamic multiple access sizes within a CAM.

A method 200 is performed by the system 100, including the CAM 110 and the processor 120. Although the method 200 is described serially, the steps of the method 200 can be performed by separate elements of the system 100 in conjunction or in parallel, whether asynchronously, in a pipelined manner, or otherwise. There is no particular requirement that the method 200 be performed in the particular order in which this description lists the steps, except where so indicated.

At a flow point 210, the system 100 is ready to operate.

At a step 211, the processor 120 determines an input tag and a selected tag width to present to the CAM arrays 112.

In a preferred embodiment, the selected tag width can be an upper-half 36-bit value, a lower-half 36-bit value, a 72-bit value, a 144-bit value (delivered in two cycles), or a 288-bit value (delivered in four cycles). The number of cycles which it takes takes to deliver the selected tag width is a function of the desired lookup rate and interface width; it is not related to the dynamic multiple access sizes.

In alternative embodiments, the selected tag widths may be 64 bits, 128 bits, and 256 bits, or any other convenient values. There is no special requirement that the selected tag widths be even, be powers of two, or that they be any particular values.

In a preferred embodiment, the processor 130 selects the input tag width in response to the type of lookup that is desired. For example, a 36-bit data value can be used to lookup an IP (internet protocol) address for a source or a destination, a 72-bit data value can be used to lookup an IP address pair for both a source and a destination, and a 144-bit data value can be used to lookup ACL (access control list) for routing.

In a preferred embodiment, the CAM array 112 can hold other routing information (such as forwarding, access control, quality of service, or other administrative information), for which class values can be set accordingly.

At a step 212, the processor 120 presents a request value (including data bits and class bits) to the CAM arrays 112 using the request register 111. Although described herein as a "register," the request register 111 is not an addressable register, in the sense that the processor cannot address the request register 111 as it might address a memory register.

At a step 213, the CAM arrays 112 receive the request value and respond thereto. Each CAM entry 123 attempts to match the request value, consistent with its CAM data cell 124 and its associated CAM mask cell 125 (the latter of which might be shared with other CAM data cells 124).

At a step 214, the sense amplifiers 113 receive signals from each CAM entry 123 of the CAM arrays 112, and generate corresponding sets of match signals indicating whether there was a match for each such CAM entry 123.

At a step 215, the size selector 114 receives the corresponding sets of match signals and determines, responsive to each selected tag width, whether there was a match for that selected tag width. As part of this step, the size selector 114 generates the set of match signals for the dynamically selected tag width.

At a step 216, the priority encoder 115 receives the sets of match signals, determines one single CAM entry 123 with the highest priority, and generates a match index for that CAM entry 123 and indicates the selected tag width.

At a step 217, the HRR file 116 receives the match index and records it in a single HRR 126. If the processor modifies entries in response to the hit, then the method 200 proceeds at a step 218. If the processor does not modify entries, then the method 200 proceeds at a step 219.

At a step 218, the match index is driven out of the chip. This occurs on every lookup.

At a step 219, the processor 130 reads the HRR 126, selects the match index it wanted, and determines what to do with that match index. The processor 130 might determine to read or to write the CAM entry 123 associated with that match index, or to perform some other operation in response thereto.

The method 200 continues with the step 211 so long as the system 100 is being operated.

Pipeline Operation

Figure 4:
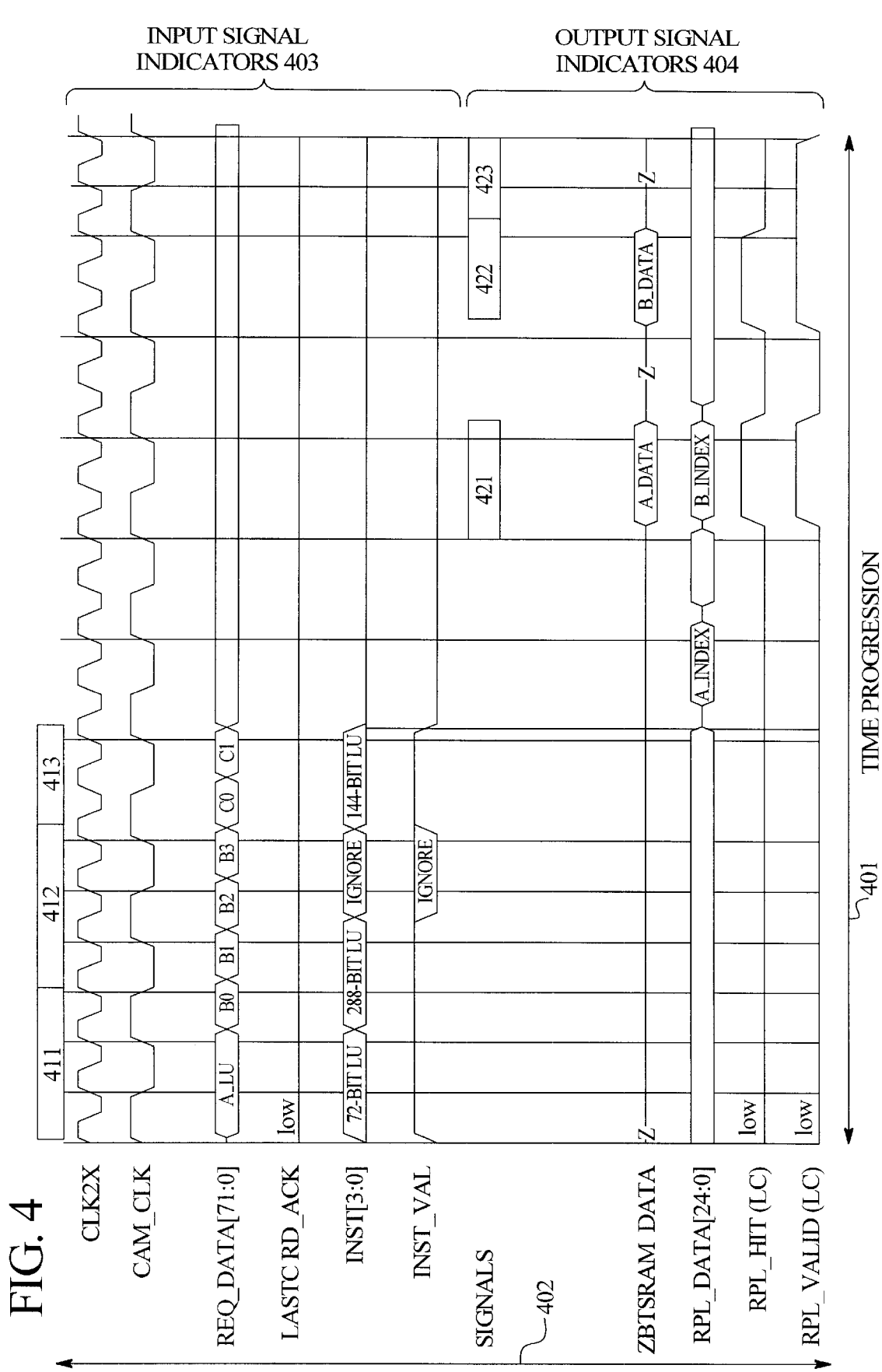
FIG. 4 shows a timing diagram of inputs and outputs to the system including dynamic multiple access sizes within a CAM.

FIG. 4 shows a timing diagram of inputs and outputs to the system including dynamic multiple access sizes within a CAM.

A timing diagram 400 includes an X-axis 401, a Y-axis 402, input signal indicators 403, and output signal indicators 404.

In the timing diagram 400, the X-axis 401 indicates the progression of time. No particular scale is indicated, although each block of time is intended to indicate one CAM cycle. Thus, if the CAM operates at 100 megahertz, each CAM cycle takes ten nanoseconds. Some time after the input is complete, output begins.

In the timing diagram 400, the Y-axis 402 is arbitrary, and serves to indicate which signals are shown.

In the timing diagram 400, the input signal indicators 403 include a first 72-bit input value 411, a second 288-bit input valued 412, and a third 144-bit input value 413.

When received by the CAM 110, the first 72-bit input value 411 is matched to produce a first 72-bit output value 421 corresponding thereto. Similarly, when received by the CAM 110, the second 288-bit input value 412 is matched to produce a second 288-bit output value 422 corresponding thereto. Similarly, when received by the CAM 110, the 144-bit input value 413 is matched to produce a third 144-bit output value 423 corresponding thereto. In this example, the input rate is equal to the look-up rate. However, this is not necessarily always the case because the amount of time devoted to input is independent of the look up rate.

Depth Cascading

Figure 3:
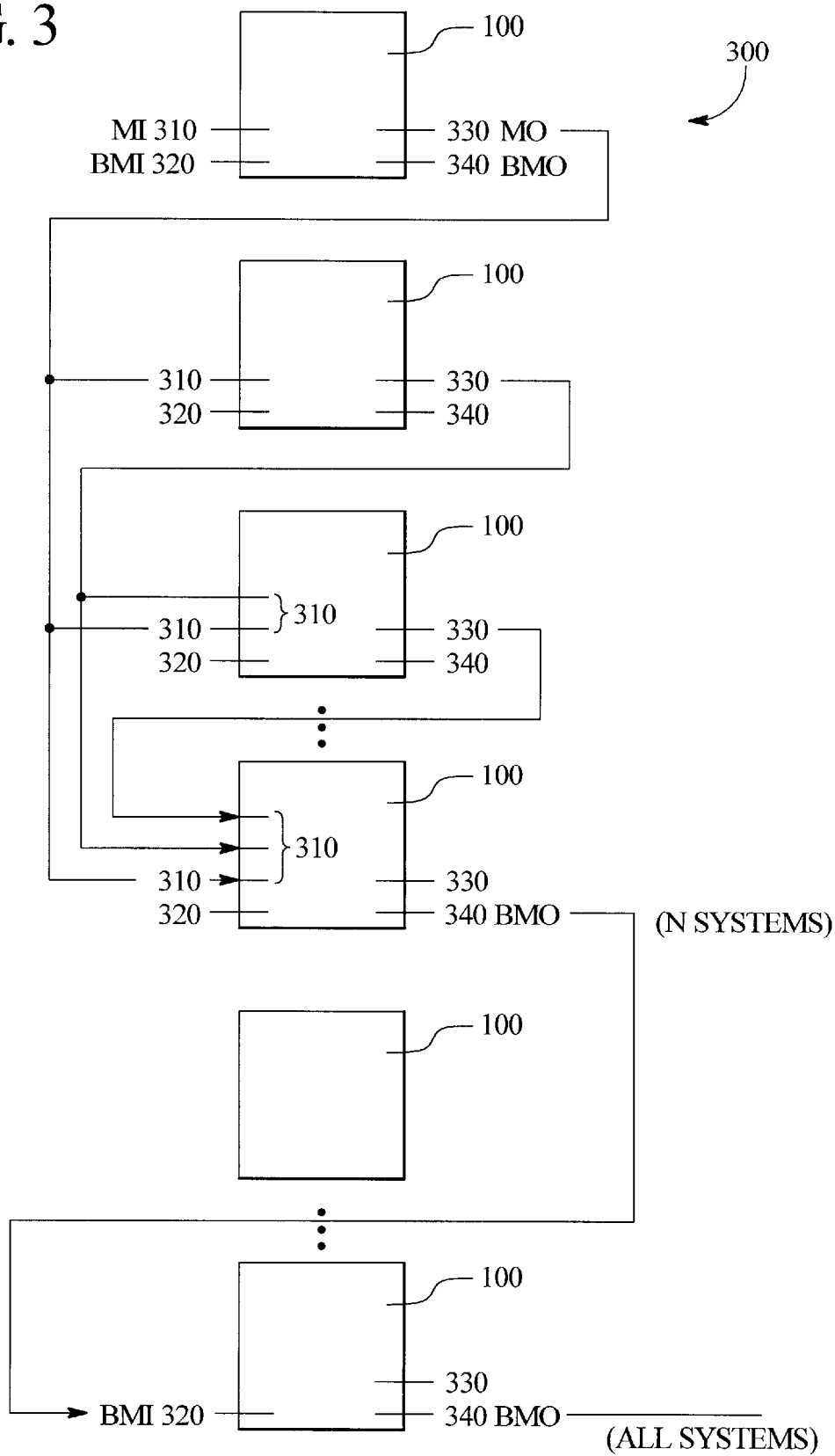
FIG. 3 shows a block diagram including use of the invention with a system including depth cascaded CAM arrays.

FIG. 3 shows a block diagram of a system including use of the invention with depth cascaded CAM arrays. As shown herein, depth cascaded CAM arrays are not required for operation of the invention; however, the invention can be used in conjunction with them.

A plurality of CAM systems 100, each includes a CAM array 112, sense amplifiers 113, and size selector 114, as described with regard to FIG. 1. The plurality of CAM systems 100 are cascaded into a single unified system 300 using a set of match-input links 310 and match-output links 330.

Each CAM system 100 generates a match-output value and presents that match-output value on its match-output link 330, thus indicating whether that particular CAM system 100 has found a match for a designated input tag (request value).

Each CAM system 100 has its match-input links 310 coupled to the match-output links 330 for a set of N (up to seven in a preferred embodiment) CAM systems 100 with higher relative addresses. Thus, the set of CAM systems 100 forms a linear array of N systems 100, with each CAM system 100 indicating to each following system 100 in the array of N whether it has found a match.

In operation, if any system 100 finds a match, it will generate a match-output value on its match-output link 330 indicating the match. The match-output values 330 will be cascaded to a match-output value on the match-output link 330 for the final system 100 in that array of N.

The time taken to cascade the match indicators might add to the latency required to obtain a response from the depth cascaded CAM arrays. However, since the results from CAM arrays are pipelined in the HRR file 116, this need not excessively slow a system designed using depth cascaded CAM arrays.

Generality of the Invention

The invention is applicable not just to routers and switches, but to all CAM systems and other generalized search memories, in which variable tag widths is desired. The invention is superior to existing CAM systems at least in that it allows for dynamic variable tag widths and more flexible treatment thereof.

Alternative Embodiments

Although preferred embodiments are disclosed herein, many variations are possible which remain within the concept, scope, and spirit of the invention, and these variations would become clear to those skilled in the art after perusal of this application.

What is claimed is:

1. A method comprising:

receiving an input tag;

identifying one or more input tag widths;

performing a first lookup in a first content-addressable memory (CAM) array to generate a first CAM result indication of which of a plurality of first CAM entries within the first CAM array produced a hit based on the input tag;

performing a second lookup in a second CAM array to generate a second CAM result indication of which of a plurality of second CAM entries within the second CAM array produced a hit based on the input tag; and generating one or more size selection CAM result indications based on the first and second CAM result indications and said one or more input tag widths;

wherein each of the plurality of first and second CAM entries include a plurality of value bits.

2. The method of claim 1, wherein when said one or more input tag widths include a first width, said one or more size selection CAM result indications indicate which corresponding locations within both the first and second CAM arrays produced a hit based on the input tag.

3. The method of claim 2, further comprising generating a single priority result value based on said one or more size selection CAM result indications.

4. The method of claim 2, wherein when said one or more input tag widths include a second width, said one or more size selection CAM result indications indicate which corresponding locations within one of the first and second CAM arrays produced a hit based on the input tag.

5. The method of claim 4, wherein said generating one or more size selection CAM result indications includes generating a first set of match bits corresponding to said first width and a second set of match bits corresponding to said second width.

6. The method of claim 5, further comprising generating a first priority result value based on the first set of match bits and a second priority result value based on the second set of match bits.

7. The method of claim 6, further comprising reading from, writing to, or reading from and writing to the first CAM array, the second CAM array, or the first and second CAM arrays based on the first priority result value, the second priority result value, or the first and second priority result values.

8. The method of claim 1, wherein when said one or more input tag widths include a second width, said one or more size selection CAM result indications indicate which corresponding locations within one of the first and second CAM arrays produced a hit based on the input tag.

9. The method of claim 8, further comprising generating a single priority result value based on said one or more size selection CAM result indications.

10. The method of claim 1, wherein each of the plurality of first and second CAM entries further includes a plurality of mask bits.

11. The method of claim 1, wherein said performing the first lookup and said performing the second lookup are performed simultaneously.

12. An apparatus comprising:
means for receiving an input tag;
means for identifying one or more input tag widths;
means for performing a first lookup in a first content-addressable memory (CAM) array to generate a first CAM result indication of which of a plurality of first CAM entries within the first CAM array produced a hit based on the input tag;
means for performing a second lookup in a second CAM array to generate a second CAM result indication of which of a plurality of second CAM entries within the second CAM array produced a hit based on the input tag; and
means for generating one or more size selection CAM result indications based on the first and second CAM result indications and said one or more input tag widths;
wherein each of the plurality of first and second CAM entries include a plurality of value bits.

13. The apparatus of claim 12, wherein when said one or more input tag widths include a first width, said one or more size selection CAM result indications indicate which corresponding locations within both the first and second CAM arrays produced a hit based on the input tag.

14. The apparatus of claim 13, further comprising means for generating a single priority result value based on said one or more size selection CAM result indications.

15. The apparatus of claim 13, wherein when said one or more input tag widths include a second width, said one or more size selection CAM result indications indicate which corresponding locations within one of the first and second CAM arrays produced a hit based on the input tag.

16. The apparatus of claim 15, wherein said means for generating one or more size selection CAM result indications includes means for generating a first set of match bits corresponding to said first width and a second set of match bits corresponding to said second width.

17. The apparatus of claim 16, further comprising means for generating a first priority result value based on the first set of match bits and a second priority result value based on the second set of match bits.

18. The apparatus of claim 17, further comprising means for reading from, writing to, or reading from and writing to the first CAM array, the second CAM array, or the first and second CAM arrays based on the first priority result value, the second priority result value, or the first and second priority result values.

19. The apparatus of claim 12, wherein when said one or more input tag widths include a second width, said one or more size selection CAM result indications indicate which corresponding locations within one of the first and second CAM arrays produced a hit based on the input tag.

20. The apparatus of claim 19, further comprising means for generating a single priority result value based on said one or more size selection CAM result indications.

21. The apparatus of claim 12, wherein each of the plurality of first and second CAM entries further includes a plurality of mask bits.

22. An apparatus comprising:
a first content-addressable memory (CAM) array including a plurality of first CAM entries, the first CAM array configured to generate a first CAM result indication of which of the plurality of first CAM entries produce a hit based on an input tag;
a second CAM array including a plurality of second CAM entries, each of the plurality of first and second CAM entries including a plurality of value bits, the second CAM array configured to generate a second CAM result indication of which of the plurality of second CAM entries produce a hit based on the input tag; and
a size selection mechanism coupled to the first and second CAM arrays, the size selection mechanism configured to generate one or more size selection CAM result indications based on the first and second CAM result indications and one or more input tag widths.

23. The apparatus of claim 22, further comprising an input request register coupled to the first and second CAM arrays, the input request register configured to store the input tag.

24. The apparatus of claim 22, wherein when said one or more input tag widths include a first width, said one or more size selection CAM result indications indicate which corresponding locations within both the first and second CAM arrays produced a hit based on the input tag.

25. The apparatus of claim 24, further comprising a priority encoder coupled to the size selection mechanism, the priority encoder configured to generate a single priority result value based on said one or more size selection CAM result indications.

26. The apparatus of claim 24, wherein when said one or more input tag widths include a second width, said one or more size selection CAM result indications indicate which corresponding locations within one of the first and second CAM arrays produced a hit based on the input tag.

27. The apparatus of claim 26, wherein said one or more size selection CAM result indications include a first set of match bits corresponding to said first width and a second set of match bits corresponding to said second width.

28. The apparatus of claim 27, further comprising a priority encoder coupled to the size selection mechanism, the priority encoder configured to generate a first priority result value based on the first set of match bits and a second priority result value based on the second set of match bits.

29. The apparatus of claim 22, wherein when said one or more input tag widths include a second width, said one or more size selection CAM result indications indicate which corresponding locations within one of the first and second CAM arrays produced a hit based on the input tag.

30. The apparatus of claim 29, further comprising a priority encoder coupled to the size selection mechanism, the priority encoder configured to generate a single priority result value based on said one or more size selection CAM result indications.

31. The apparatus of claim 22, wherein each of the plurality of first and second CAM entries further includes a plurality of mask bits.

32. A method comprising:
   receiving an input tag;
   identifying a selected input tag width, the selected input tag width being one of a plurality of possible input tag widths;
   performing a first lookup in a first content-addressable memory (CAM) array to generate a first CAM result indication of which of a plurality of first CAM entries within the first CAM array produced a hit based on the input tag;
   performing a second lookup in a second CAM array to generate a second CAM result indication of which of a plurality of second CAM entries within the second CAM array produced a hit based on the input tag; and
   generating one or more size selection CAM result indications based on the first and second CAM result indications and the selected input tag width;
   wherein each of the plurality of first and second CAM entries include a plurality of value bits.

33. The method of claim 32, wherein when the selected input tag width corresponds to a first width, said one or more size selection CAM result indications indicate which corresponding locations within both the first and second CAM arrays produced a hit based on the input tag.

34. The method of claim 33, further comprising generating a single priority result value based on said one or more size selection CAM result indications.

35. The method of claim 33, wherein when the selected input tag width corresponds to a second width, said one or more size selection CAM result indications indicate which locations within the first and second CAM arrays produced a hit based on the input tag.

36. The method of claim 35, wherein said generating one or more size selection CAM result indications includes generating a first set of match bits corresponding to said first width and a second set of match bits corresponding to said second width.

37. The method of claim 36, further comprising generating a first priority result value based on the first set of match bits and a second priority result value based on the second set of match bits.

38. The method of claim 37, further comprising reading from, writing to, or reading from and writing to the first CAM array, the second CAM array, or the first and second CAM arrays based on the first priority result value, the second priority result value, or the first and second priority result values.

39. The method of claim 32, wherein when the selected input tag width corresponds to a second width, said one or more size selection CAM result indications indicate which locations within the first and second CAM arrays produced a hit based on the input tag.

40. The method of claim 39, further comprising generating a single priority result value based on said one or more size selection CAM result indications.

41. The method of claim 32, wherein each of the plurality of first and second CAM entries includes a plurality of mask bits.

42. The method of claim 32, wherein said performing the first lookup and said performing the second lookup are performed simultaneously.

43. An apparatus comprising:
   means for receiving an input tag;
   means for identifying a selected input tag width, the selected input tag width being one of a plurality of possible input tag widths;
   means for performing a first lookup in a first content-addressable memory (CAM) array to generate a first CAM result indication of which of a plurality of first CAM entries within the first CAM array produced a hit based on the input tag;
   means for performing a second lookup in a second CAM array to generate a second CAM result indication of which of a plurality of second CAM entries within the second CAM array produced a hit based on the input tag; and
   means for generating one or more size selection CAM result indications based on the first and second CAM result indications and the selected input tag width;
   wherein each of the plurality of first and second CAM entries include a plurality of value bits.

44. The apparatus of claim 43, wherein when the selected input tag width corresponds to a first width, said one or more size selection CAM result indications indicate which corresponding locations within both the first and second CAM arrays produced a hit based on the input tag.

45. The apparatus of claim 44, further comprising means for generating a single priority result value based on said one or more size selection CAM result indications.

46. The apparatus of claim 44, wherein when the selected input tag width corresponds to a second width, said one or more size selection CAM result indications indicate which locations within the first and second CAM arrays produced a hit based on the input tag.

47. The apparatus of claim 46, wherein said means for generating one or more size selection CAM result indications includes means for generating a first set of match bits corresponding to said first width and a second set of match bits corresponding to said second width.

48. The apparatus of claim 47, further comprising means for generating a first priority result value based on the first set of match bits and a second priority result value based on the second set of match bits.

49. The apparatus of claim 48, further comprising means for reading from, writing to, or reading from and writing to the first CAM array, the second CAM array, or the first and second CAM arrays based on the first priority result value, the second priority result value, or the first and second priority result values.

50. The apparatus of claim 43, wherein when the selected input tag width corresponds to a second width, said one or more size selection CAM result indications indicate which locations within the first and second CAM arrays produced a hit based on the input tag.

51. The apparatus of claim 50, further comprising means for generating a single priority result value based on said one or more size selection CAM result indications.

52. The apparatus of claim 43, wherein each of the plurality of first and second CAM entries includes a plurality of mask bits.

53. An apparatus comprising:
a first content-addressable memory (CAM) array including a plurality of first CAM entries, the first CAM array configured to generate a first CAM result indication of which of the plurality of first CAM entries produce a hit based on an input tag;
a second CAM array including a plurality of second CAM entries, each of the plurality of first and second CAM entries including a plurality of value bits, the second CAM array configured to generate a second CAM result indication of which of the plurality of second CAM entries produce a hit based on the input tag; and
a size selection mechanism coupled to the first and second CAM arrays, the size selection mechanism configured to generate one or more size selection CAM result indications based on the first and second CAM result indications and a selected input tag width, the selected input tag width being one of a plurality of possible input tag widths.

54. The apparatus of claim 53, further comprising an input request register coupled to the first and second CAM arrays, the input request register configured to store the input tag.

55. The apparatus of claim 53, wherein when the selected tag width corresponds to a first width, said one or more size selection CAM result indications indicate which corresponding locations within both the first and second CAM arrays produced a hit based on the input tag.

56. The apparatus of claim 55, further comprising a priority encoder coupled to the size selection mechanism, the priority encoder configured to generate a single priority result value based on said one or more size selection CAM result indications.

57. The apparatus of claim 55, wherein when the selected tag width corresponds to a second width, said one or more size selection CAM result indications indicate which corresponding locations within one of the first and second CAM arrays produced a hit based on the input tag.

58. The apparatus of claim 57, wherein said one or more size selection CAM result indications include a first set of match bits corresponding to said first width and a second set of match bits corresponding to said second width.

59. The apparatus of claim 58, further comprising a priority encoder coupled to the size selection mechanism, the priority encoder configured to generate a first priority result value based on the first set of match bits and a second priority result value based on the second set of match bits.

60. The apparatus of claim 53, wherein when the selected tag width corresponds to a second width, said one or more size selection CAM result indications indicate which corresponding locations within one of the first and second CAM arrays produced a hit based on the input tag.

61. The apparatus of claim 60, further comprising a priority encoder coupled to the size selection mechanism, the priority encoder configured to generate a single priority result value based on said one or more size selection CAM result indications.

62. The apparatus of claim 53, wherein each of the plurality of first and second CAM entries further includes a plurality of mask bits.

* * * * *

UNITED STATES PATENT AND TRADEMARK OFFICE
CERTIFICATE OF CORRECTION

PATENT NO. : 6,526,474 B1
DATED : February 25, 2003
INVENTOR(S) : Mark A. Ross

It is certified that error appears in the above-identified patent and that said Letters Patent is hereby corrected as shown below:

Title page, Item [54] and Column 1, line 1,
Title, replace "RESULT" with -- RESULTS --

Column 3,
Line 23, replace ".113" with -- 113 --
Line 23, replace ".113" with -- 113 --
Lines 49-53, replace
"A single CAM entry 123 in one of the two CAM arrays 112
(for a 72 bit match); or
A matched pair of CAM entries 123 at corresponding
locations in both of the two CAM arrays (for a 144 bit
match)." with
-- • A single CAM entry 123 in one of the two CAM arrays 112
(for a 72 bit match); or
• A matched pair of CAM entries 123 at corresponding
locations in both of the two CAM arrays (for a 144 bit
match). --
Column 3,
Line 60, replace "112." with -- 112 --

Signed and Sealed this

Fourth Day of January, 2005

JON W. DUDAS
*Director of the United States Patent and Trademark Office*